US009638746B2

United States Patent
Nakata et al.

(10) Patent No.: US 9,638,746 B2
(45) Date of Patent: May 2, 2017

(54) PROBE CARD AND INSPECTION DEVICE

(71) Applicant: Kabushiki Kaisha Nihon Micronics, Tokyo (JP)

(72) Inventors: Yoshiro Nakata, Tokyo (JP); Yoshinori Kikuchi, Tokyo (JP); Hirose Fujita, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 295 days.

(21) Appl. No.: 14/092,057

(22) Filed: Nov. 27, 2013

(65) Prior Publication Data

US 2014/0145741 A1 May 29, 2014

(30) Foreign Application Priority Data

Nov. 28, 2012 (JP) .................. 2012-260262
Jul. 8, 2013 (JP) .................. 2013-142572

(51) Int. Cl.
*G01R 1/073* (2006.01)
*G01R 31/28* (2006.01)

(52) U.S. Cl.
CPC ..... *G01R 31/2889* (2013.01); *G01R 1/07378* (2013.01)

(58) Field of Classification Search
CPC ...... G01R 1/07342; G01R 1/07; G01R 1/073; G01R 1/07307; G01R 1/07314
USPC ............ 324/754.07, 754.01, 754.03, 754.08, 324/754.12, 754.13, 756.01, 756.03, 324/756.04, 756.05, 756.07, 762.01, 538
See application file for complete search history.

(56) References Cited

U.S. PATENT DOCUMENTS

| 5,517,126 A * | 5/1996 | Yamaguchi ........ G01R 1/07371 324/750.25 |
| 6,541,989 B1 * | 4/2003 | Norris ................ G01R 31/2831 324/754.03 |
| 7,586,316 B2 * | 9/2009 | Kuniyoshi ......... G01R 1/07307 324/756.03 |
| 2002/0105354 A1 * | 8/2002 | Fujimoto ............. G01R 1/0735 324/754.03 |

(Continued)

FOREIGN PATENT DOCUMENTS

| CN | 1675755 A | 9/2005 |
| CN | 102074825 A | 5/2011 |

(Continued)

OTHER PUBLICATIONS

Office Action mailed Dec. 2, 2015 for the corresponding Chinese Patent Application No. 201310626022.4.

(Continued)

*Primary Examiner* — Tung X Nguyen
*Assistant Examiner* — Robert P Alejnikov, Jr.
(74) *Attorney, Agent, or Firm* — Leason Ellis LLP

(57) ABSTRACT

A probe card comes in touch with a test object to perform an inspection. The probe card contains: a probe substrate provided with a plurality of probes on the first surface and a plurality of anchor receiving portions on the second surface; and a supporting body disposed to support the periphery of the probe substrate, with at least a plurality of anchor receiving portions located within a probe existence region being arranged regularly and at an equal distance from each other on the second surface of the probe substrate.

21 Claims, 12 Drawing Sheets

(56) References Cited

U.S. PATENT DOCUMENTS

| | | | |
|---|---|---|---|
| 2005/0278969 A1* | 12/2005 | Jordil | G01B 5/012 |
| | | | 33/559 |
| 2007/0007977 A1 | 1/2007 | Eldridge et al. | |
| 2008/0122466 A1 | 5/2008 | Miyagi et al. | |
| 2008/0186040 A1 | 8/2008 | Hobbs et al. | |
| 2008/0315905 A1 | 12/2008 | Kuniyoshi et al. | |
| 2011/0316576 A1 | 12/2011 | Kataoka et al. | |
| 2012/0038383 A1 | 2/2012 | Wu et al. | |
| 2012/0062259 A1 | 3/2012 | Yamada et al. | |
| 2012/0126843 A1* | 5/2012 | Shibahara | G01R 31/2889 |
| | | | 324/756.03 |

FOREIGN PATENT DOCUMENTS

| | | |
|---|---|---|
| JP | 2008-216060 A | 9/2008 |
| JP | 2011-89891 A | 5/2011 |
| KR | 10-0443999 B | 8/2004 |
| KR | 10-0942166 B | 2/2010 |
| TW | 200925612 A | 6/2009 |
| TW | 201234029 A | 8/2012 |

OTHER PUBLICATIONS

Office Action mailed Jun. 17, 2015 for the corresponding Korean Patent Application No. 10-2013-0145993.
Office Action mailed Nov. 16, 2015 for the corresponding Korean Patent Application No. 10-2013-0145993.
Office Action mailed Jun. 3, 2015 for the corresponding Taiwanese Patent Application No. 102143010.

\* cited by examiner

PROBE CARD AND INSPECTION DEVICE

This application claims the benefit of Japanese Patent Applications No. 2012-260262, filed Nov. 28, 2012, and No. 2013-142572, filed Jul. 8, 2013, the entire contents of which are hereby incorporated by reference.

FIELD OF THE INVENTION

The present invention relates to a probe card and an inspection device used for an energization test on a semiconductor integrated circuit.

BACKGROUND OF THE INVENTION

Conventionally, a probe card having probes that come in contact with plural electrodes on a test object respectively is used for an electrical inspection of a test object such as semiconductor integrated circuits. Typically the probe card has a disk-like shape. Plural probes to be connected electrically with the test object are provided on a first surface of the probe card. A periphery of the probe card is supported detachably by the inspection device.

In such probe cards, sometimes probes do not come in contact with electrodes on a test object when the flatness of the plane defined by the tips of a plurality of probes does not meet a prescribed flatness (30 μm or less, for instance), disabling the electrical inspection. To prevent such trouble, an inspection device is provided in which the flatness of the probe card is adjustable to allow maintaining the flatness of a first surface of the probe card to be equal or smaller than the prescribed value of flatness (refer to JP 2008-216060 A).

In this inspection device, a plurality of anchor receiving portions having an internal thread are provided on one surface of the probe substrate of the probe card which is opposite to the surface provided with the probes. Further, a reference body is disposed on such opposite side of the probe card, with a pogo pin block and a wiring board is sandwiched between the probe card and the reference body. The reference body is provided with anchor portions having an external screw at each tip to be screwed with the internal thread of the respective anchor receiving portions.

In this inspection device, the flatness of the probe card can be corrected by adjusting the screwing condition of the external screw on the anchor portion relative to the internal thread on the anchor receiving portion to displace the position of the probe card relative to the reference body.

Problem to be Solved by the Invention

Referring to FIG. 10, anchor receiving portions 134a, 134b of a probe card 132 in this inspection device, for instance, are formed on concentric circles 136, 138 on the opposite side of the probe card as shown in FIG. 10. The four (4) anchor receiving portions 134a formed on the concentric circle 136 are disposed at even intervals on the concentric circle 136. Similarly, the eight (8) anchor receiving portions 134b formed on the concentric circle 138 are disposed at even intervals on the concentric circle 138.

The four (4) anchor receiving portions 134a disposed on the concentric circle 136 in FIG. 10, form regions enclosed by three (3) neighboring anchor receiving portions 134a, namely two unit shapes 140 having an isosceles triangle shape, when three (3) neighboring anchor receiving portions 134a are connected with each other by hypothetical lines.

In addition, the eight (8) anchor receiving portions 134b disposed on the concentric circle 138 form isosceles triangle unit shapes 142 enclosed by one (1) anchor receiving portion 134b and two (2) anchor receiving portions 134a, and isosceles triangle unit shapes 144 enclosed by two (2) anchor receiving portions 134b and one (1) anchor receiving portion 134a, when the anchor receiving portions 134a and the anchor receiving portions 134b that are neighboring with each other are connected by hypothetical lines.

The areas of these isosceles triangles 140, 142, 144 in FIG. 10 are different since each isosceles triangle has different side length. Namely, each of the regions enclosed by the three (3) anchor receiving portions 134a, 134b has a different area (dimensions), resulting in the difference in the area of the unit shape supported by each of the anchor receiving portions 134a, 134b. Consequently, when the force causing deflection is applied to the probe card, the force exerted on each anchor receiving portion 134a, 134b will be different, and the amount of deflections caused by the force in the range of unit shapes 140, 142, 144 each having an isosceles triangle shape will be different with each other. Thus, the flatness of the probe card will be impaired.

SUMMARY OF THE INVENTION

In regard to the concerns described above, an object of the present invention is to restrict the degradation of flatness of the probe card by restraining the deflection of the probe card while a test object is inspected.

Means for Solving the Problem

For the purpose of accomplishing the above object, a probe card according to a first aspect of the present invention is a probe card to perform an inspection by coming in contact with a test object, including:

a probe substrate having a plurality of probes on a first surface, and a plurality of anchor receiving portions on a second surface; and a supporting body disposed to support a periphery of the probe substrate, in which, on the second surface of the probe substrate, at least a plurality of anchor receiving portions located within a probe existence region are arranged regularly and at equal distances from each other.

According to this aspect, at least the plurality of anchor receiving portions located within the probe existence region being arranged regularly and at an equal distance from each other on the second surface of the probe card, and thus the regions formed by the plurality of anchor receiving portions arranged regularly and neighboring at an equal distance from each other on the probe card have equal areas. In other words, in the probe existence region on the probe card, each of the unit areas on the probe card supported by the respective anchors can be made equal when the probe card is supported by the reference body having the anchors abutted on the anchor receiving portions. Thus, the amount of force applied to deflect the probe card does not vary among every anchor and every unit area mentioned above, and such force is uniformly exerted on each unit area. As a result, the deflection of the probe card is restricted, and the flatness of the probe card is kept from being degraded.

It should be noted that "probe existence region" in this specification refers to the region within a circle using a distance from the center of the probe card to a probe at the farthest position from the center of the probe card toward the outer periphery.

Also, regarding the phrase "at equal distance from each other" included in the description "the anchor receiving portions are disposed at equal distance from each other" in this specification is not required to be at equal distance in the strict sense of the word. Even when the positions of the axis of the anchor receiving portions are out of alignment with the positions of the axis of the anchors, the distances between the neighboring anchor receiving portions are considered to be "equal" in this specification, on condition that at least part of the abutting surface on the anchor receiving portions and the anchors are in contact with each other.

The probe card according to a second aspect of the present invention is the probe card in the first aspect, in which at least two unit shapes exist, with the unit shapes being formed by the plurality of the anchor receiving portions, which are disposed regularly and at equal distances in a radial direction from a center of the probe substrate and which are neighboring with each other.

According to this aspect, the plurality of unit shapes having equal areas are disposed in the radial direction from the center of the probe substrate within the probe existence region on the probe substrate. Thus, the equal amount of force is exerted on each unit shape when the deflecting force is applied to the probe substrate. Consequently, the flatness of the probe substrate is kept from being degraded, since the amount of deflection is equal between each unit shape even when the probe substrate is deflected.

The probe card according to a third aspect of the present invention is the probe card in the second aspect, in which the unit shapes formed by the three neighboring anchor receiving portions have an equilateral triangle shape.

According to this aspect, the equilateral triangle unit shapes composed with the anchor receiving portions to have equal areas are formed within the probe existence region on the probe card. Thus, when the force causing deflection on the probe substrate is applied to the probe substrate, the force is exerted equally on all equilateral triangle unit shapes. This means no difference is caused regarding the force exerted on each unit shape, and the difference in the amount of deflection among the unit shape can be restricted. Consequently, the flatness of the probe substrate can be maintained to be equal to or smaller than the predetermined value (30 μm or less, for instance).

The probe card according to a fourth aspect of the present invention is the probe card in the second aspect, in which the unit shapes formed by the four neighboring anchor receiving portions have a square shape.

According to this aspect, the square unit shapes composed with the anchor receiving portions to have equal areas are formed within the probe existence region on the probe card. Thus, when the force causing deflection on the probe substrate is applied to the probe substrate, the force is exerted equally on all square unit shapes. This means no difference is caused regarding the force exerted on each unit shape, and the difference in the amount of deflection among the unit shape can be restricted. Consequently, the flatness of the probe substrate can be maintained to be equal to or smaller than the predetermined value (30 μm or less, for instance).

The probe card according to a fifth aspect of the present invention is the probe card in the first aspect or the second aspect, in which one of the plurality of anchor receiving portions is disposed in the center of the probe substrate.

According to this aspect, the center of the probe substrate is supported by an anchor, since an anchor receiving portion is provided in the center of the probe substrate, which means the rigidity of the probe substrate is improved. As a result, the deflection of the probe substrate is inhibited, and the flatness of the probe card is kept from being degraded.

The probe card according to a sixth aspect of the present invention is the probe card in the first aspect or the second aspect, in which a plurality of terminals which come in contact with a plurality of pogo pins individually are provided on the second surface of the probe substrate, and a sealing member contact region is provided to form a low pressure chamber on the outside of a terminal existence region and inside of an outer periphery of the probe substrate.

The terminal existence region on the probe card receives reaction force from the pogo pins when the probe card is supported by the reference body by abutting the anchor receiving portions on the anchor portions. Thus, in the low pressure chamber inside of the outer periphery of the probe substrate, the force received by the probe substrate is balanced between the atmospheric pressure and the reaction force from the pogo pins within the terminal existence region. On the contrary, no reaction force from the pogo pins are available on the outside of the terminal existence region, and the force received by the probe substance is not balanced. This will result in a difference in the deflection generated on the inside and outside of the terminal existence region on the probe substrate.

In this embodiment, the sealing member contact region is provided on the outside of the terminal existence region and inside of the outer periphery of the probe substrate. Thus, the region which receives no reaction force from the pogo pins becomes smaller within the low pressure chamber formed on the inside of the outer periphery of the probe substrate. Accordingly, the difference in the deflection generated on the probe substrate is reduced.

Also, according to this embodiment, the reaction force from the pogo pin block is received in the sealing member contact region on the probe substrate by way of the sealing member coming in contact with the probe substrate. Thus, a terminal existence region and the sealing member contact region on the probe substrate respectively receive reaction force from the pogo pins and the pogo pin block. As a result, deflection caused by the presence or absence of the reaction force in the terminal existence region and outside the terminal existence region is prevented, restraining the degradation of flatness on the probe card.

The probe card according to a seventh aspect of the present invention is the probe card in the first aspect or the second aspect, in which the plurality of terminals which come in contact with the plurality of pogo pins individually are provided on the second surface of the probe substrate, and a sealing member is provided to form a low pressure chamber on the outside of the terminal existence region and inside of an outer periphery of the probe substrate.

According to this aspect, the terminal existence region on the probe card receives reaction force from the pogo pins when the probe card is supported by the reference body by abutting the anchor receiving portions on the anchor portions. In this state, the area outside the terminal existence region on the probe substrate comes in touch with the pogo pin block via the sealing member, to receive the reaction force from the pogo pin block. Thus, the terminal existence region and the area outside the terminal existence region on the probe substrate respectively receive reaction force from the pogo pins and the pogo pin block. As a result, deflection caused by the presence or absence of the reaction force in the terminal existence region and outside the terminal existence region is prevented, restraining the degradation of flatness on the probe card.

The probe card according to an eighth aspect of the present invention is the probe card in the first aspect or the second aspect, in which at least one anchor receiving portion is provided within the probe existence region on the second surface of the probe substrate, in addition to the plurality of anchor receiving portions disposed regularly and at an equal distance from each other, and a distance between the at least one anchor receiving portion and the neighboring plurality of anchor receiving portions are different from the distances between the plurality of anchor receiving portions.

According to this aspect, the plurality of unit shapes of equal area are formed by the plurality of anchor receiving portions disposed regularly and at an equal distance from each other within the probe existence region on the second surface of the probe substrate. Thus, when the force causing deflection on the probe substrate is applied to the probe substrate, an equal amount of force is exerted on all unit shapes. Consequently, the flatness of the probe substrate is kept from being degraded, since the amount of deflection is equal between each unit area even when the probe substrate is deflected.

As described above, in a state where the anchor receiving portions are disposed regularly and at an equal distance to form the unit shapes of equal area on the probe substrate, the degradation of flatness of the probe substrate is negligible even when other anchor receiving portion positioned at different distance is provided. Thus, other anchor receiving portion described above can be provided, if necessary, without degrading the flatness.

An inspection device according to a ninth aspect of the present invention is an inspection device that includes:

the probe card according to the first aspect or the second aspect, a pogo pin block positioned on the second surface side of the probe substrate and provided with the plurality of pogo pins that are electrically connected with the terminals, a reference body having a plurality of anchor portions to be abutted on the anchor receiving portions of the probe card, and defining the flatness of the probe card when the anchor receiving portions are abutted on the anchor portions, a wiring board disposed between the pogo pin block and the reference body and having a plurality of terminals individually connected electrically to opposite sides to those coming in touch with the terminals of the pogo pins, a prober to which the probe card is attached via the supporting body, and having a stage on which the test object to come in touch with the probes on the probe card is placed, and a tester to be connected electrically with the wiring board.

According to this aspect, the same effects as those of any one of the first to eighth aspects can be produced in this inspection device.

BRIEF DESCRIPTION OF THE DRAWINGS

These and other features and advantages of the present invention will become more readily appreciated when considered in connection with the following detailed description and appended drawings, wherein like designations denote like elements in the various views, and wherein:

FIG. 4 (B) is a side cross sectional view showing the state where the probe substrate and the supporting member of the probe card are disassembled.

DETAILED DESCRIPTION OF THE INVENTION

Embodiment for Carrying Out the Invention

Figure 1:
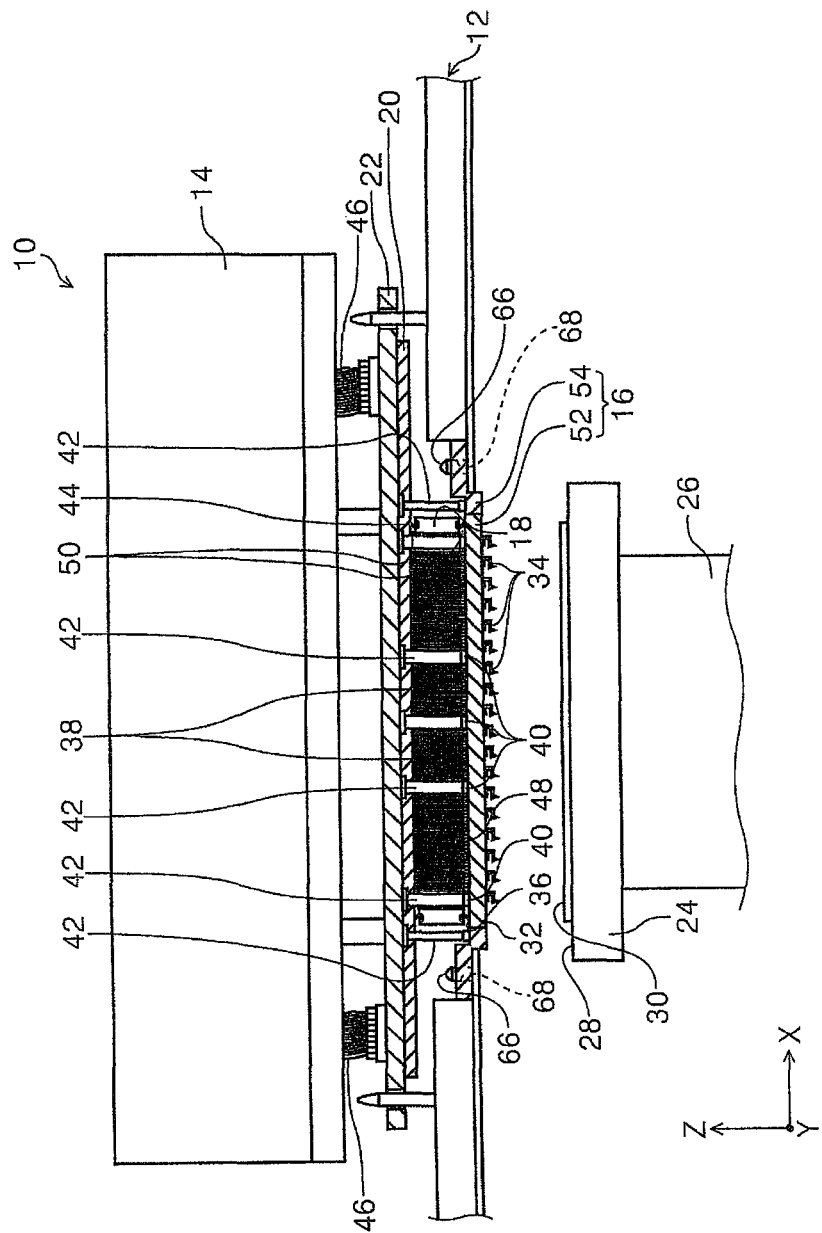
FIG. 1 is a side view of an inspection device including a probe card according to the first embodiment of the present invention.

Description is hereinafter made of embodiments of the present invention based on the drawings. The common constituent elements in all the embodiments, which are designated by the same reference numerals, are described only in the first embodiment and their description is omitted in the subsequent embodiments.

The constituent elements of an inspection device 10 are described with reference to FIGS. 1 and 2. The inspection device 10 has a prober 12, a tester 14, a probe card 16, a pogo pin block 18, a wiring board 20 and a reference body 22. The prober 12 has a chuck top 24, and an inspection stage 26.

The inspection stage 26 is constituted by combining an X-stage, a Y-stage, a Z-stage, and a θ-stage. The chuck top 24 is mounted on top of the inspection stage 26. Thus, the chuck top 24 is positionally adjustable in an X-axis direction, a Y-axis direction which is orthogonal to the X-axis direction on a horizontal plane, and a Z-axis direction which is vertical to the horizontal plane (XY plane). Also, the chuck top 24 is rotationally adjustable in a θ-direction about the Z-axis.

A mounting surface 28, on which a test object 30 is mounted, is provided on the chuck top 24. In this embodiment, the test object 30 is a semiconductor wafer into which a multiplicity of integrated circuits is incorporated.

The probe card 16 supported by the prober 12 at its periphery is disposed above a mounting surface 28 of the chuck top 24. A plurality of probes 34 are disposed on an under surface 32, namely a "first surface" of the probe card 16 and a surface on the negative side of Z-axis in FIG. 1, in a manner that the probes 34 protrude from the under surface 32 in the negative direction of Z-axis.

Figure 2:
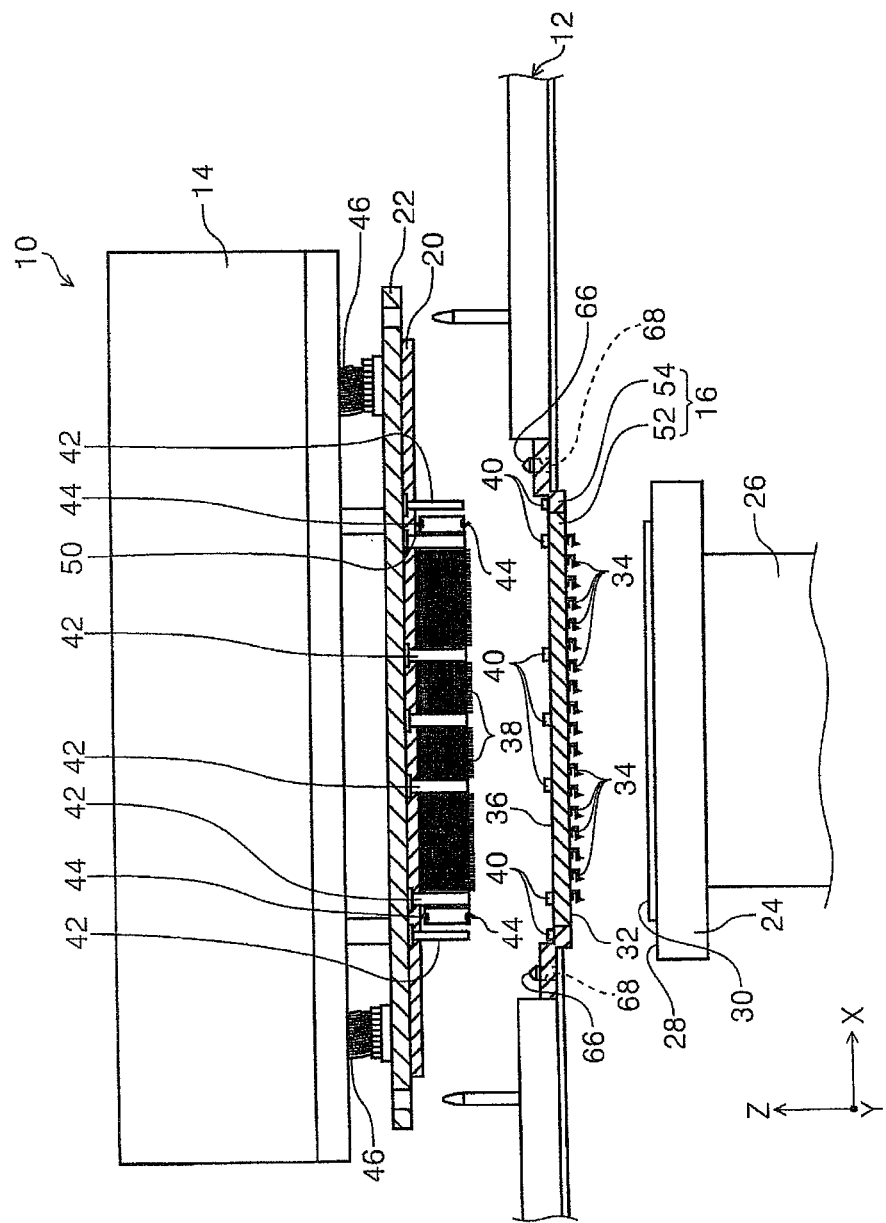
FIG. 2 is a side view showing the state where the probe card and the pogo pin block are separated on the inspection device according to the present invention.

The pogo pin block 18 is disposed on an upper surface 36, namely a "second surface" of the probe card 16 and a surface on the positive side of Z-axis in FIG. 1. The pogo pin block 18 includes a plurality of pogo pins 38. The pogo pin block 18 electrically connects the probes 34 on the probe card 16 with respective terminals 21 (refer to FIG. 6) on the wiring board 20, when, as will be described later, anchor receiving portions 40 of the probe card 16 are abutted on anchor portions 42 provided on the reference body. The pogo pin block 18 is provided with an annular sealing member 44 on the outside of the existence region of the pogo pins 38 on the upper surface and the under surface of the pogo pin block 18.

The wiring board 20 is disposed above the pogo pin block 18, namely the positive side of Z-axis in FIG. 1. The plurality of terminals 21 (refer to FIG. 6), being in contact with the pogo pins 38 respectively, are provided on the under surface of the wiring board 20. The wiring board 20 is attached to the under surface of the reference body 22. Electric paths (not shown) are provided in the wiring board 20 and the reference body 22. First ends of the electric paths are connected to the respective terminals 21 on the under surface of the wiring board 20, and second ends of the electric paths are connected to the electrodes (not shown) provided on the upper surface of the reference body 22, respectively. The electrodes on the reference body 22 are electrically connected with the tester 14 via connecting cables 46.

The reference body 22 has the plurality of anchor portions 42 protruding toward the probe card 16 via the wiring board 20. The reference body 22 is supported by the tester 14 located above the reference body, namely in the positive direction of Z-axis relative to the reference body. The tester 14 is formed to be movable in the Z-axis direction.

Thus, a space 48 enclosed by the sealing member 44 is formed between the upper surface 36 of the probe card 16 and the under surface of the pogo pin block 18, when the tester 14 is displaced in the negative direction of Z-axis to bring the lower end of the pogo pins 38 to come in contact with terminals 87 of the probe substrate 52, causing the upper surface 36 of the probe card 16 to touch the sealing member 44 on the under surface end of the pogo pin block 18. A negative pressure is created in the space 48 by evacuating the space 48 using an air supply and exhaust means which is not shown. In other words, the space 48 forms a low pressure chamber. Alternatively, the sealing member 44 on the under surface end of the pogo pin block 18 may be designed to touch a supporting body 54 instead of the upper surface 36 of the probe card 16.

Figure 7:
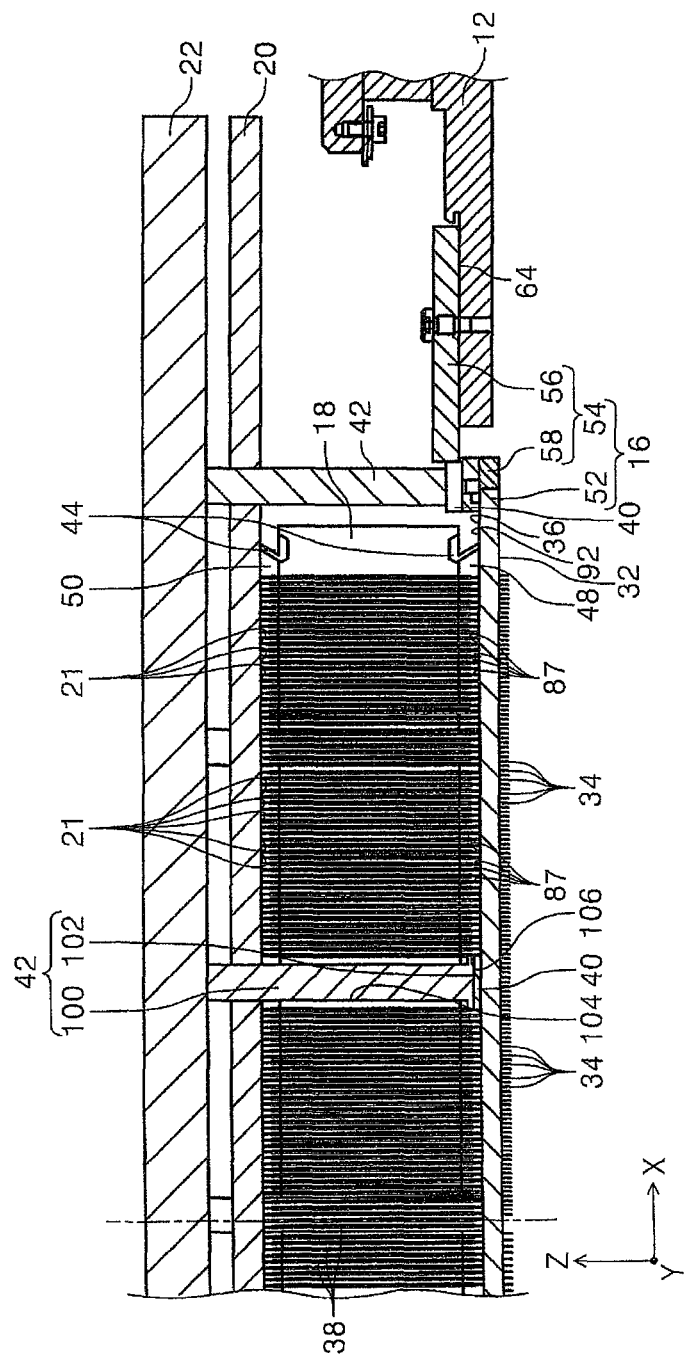
FIG. 7 is a side cross sectional view showing the state where the probe card according to the first embodiment of the present invention is supported by the reference body via the anchor receiving portions and the anchor portions.

Referring to FIG. 7, a space 50 enclosed by the sealing member 44 is formed between the upper surface of the pogo pin block 18 and the under surface of the reference body 22 because of the presence of sealing member 44 at the upper surface end of the pogo pin block 18. A negative pressure is created in the space 50 by evacuating the space 50 using an air supply and exhaust means which is not shown. In other words, the space 50 forms a low pressure chamber.

It should be noted that by making the space 50 and the space 48 communicate with each other to form a single space via a space within the pogo pins 38 and a through hole (not shown) provided on the pogo pin block 18 to penetrate from the upper surface to the under surface, the space 48 and the space 50 can be evacuated from either end of the space to form the low pressure state simultaneously.

The pressure in the sealed spaces 48, 50 become lower relative to the outside atmospheric pressure, as the evacuation in the space 48 and in the space 50 is progressed. Due to the pressure difference relative to the outside atmospheric pressure, the distance between the wiring board 20 and the probe substrate 52 is reduced while the pogo pins 38 is pressed-in toward the pogo pin block 18. Eventually, the anchor portions 42 abuts on the anchor receiving portions 40 on the probe substrate 52, and the wiring board 20 and the probe substrate 52 do not come closer. At the same time, the pogo pin 38 is not pressed-in any farther.

Consequently, the probes 34 of the probe card 16 is electrically connected to the tester 14 via the pogo pins 38, terminals of the wiring board 20, an electric path (not shown) in the wiring board 20 and the reference body 22, electrodes (not shown) provided on the upper surface of the reference body 22, and the connecting cables 46. Thus, the inspection device 10 becomes capable of inspecting a test object 30.

First Embodiment

Figure 3:
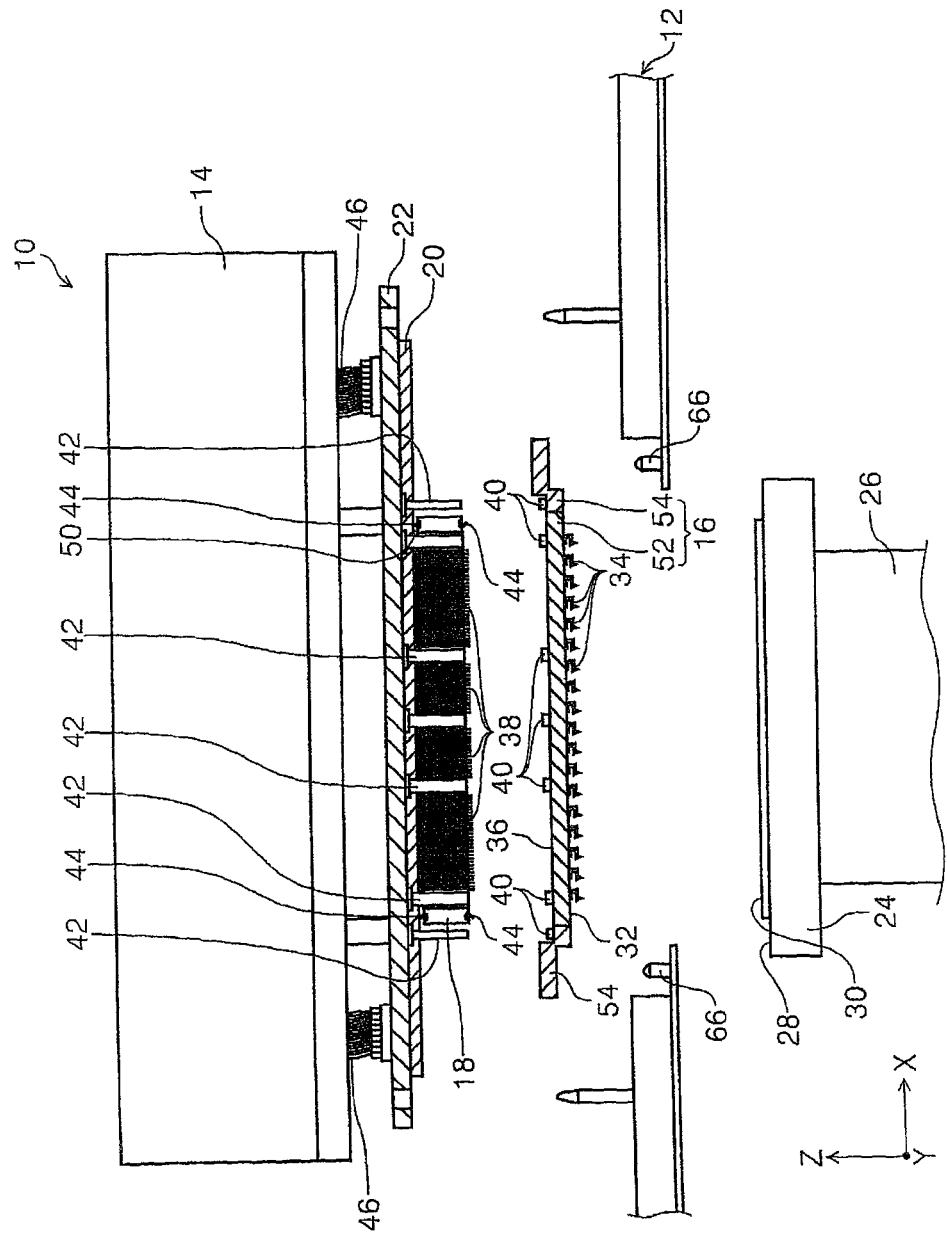
FIG. 3 is an exploded side view showing the state where the probe card, the pogo pin block, the prober and other elements are separated from each other on the inspection device according to the present invention.
Figure 4:
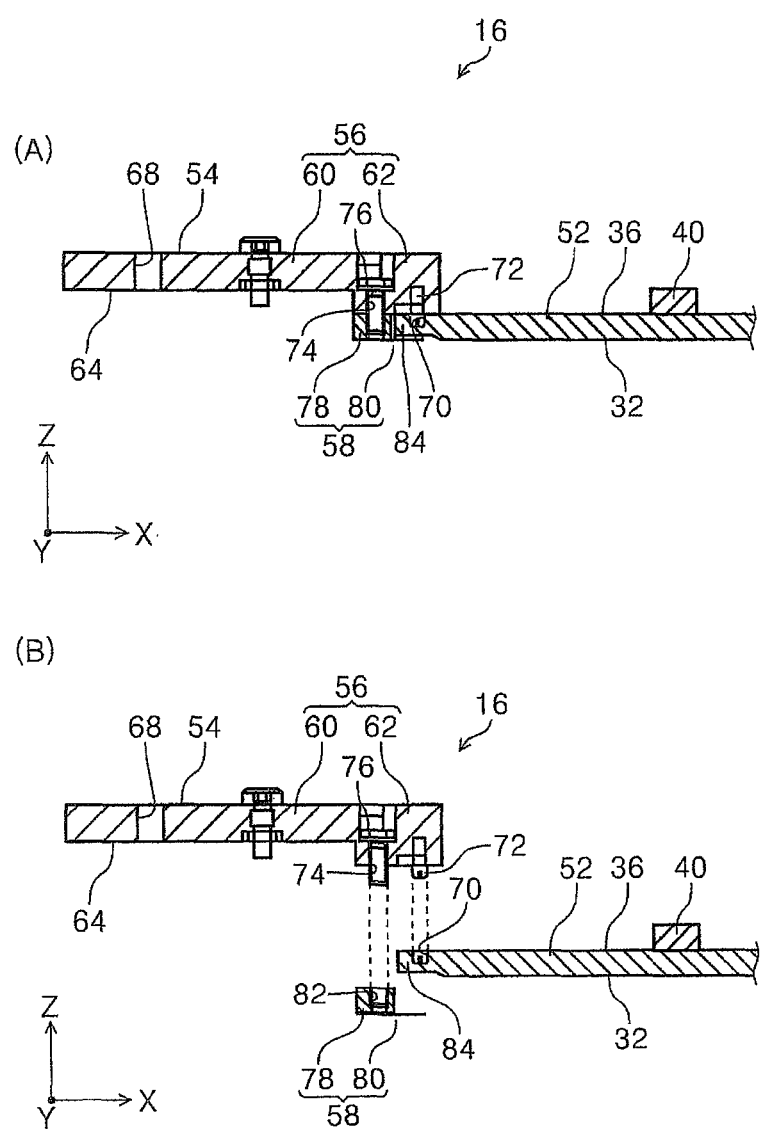
FIG. 4 (A) is a side cross sectional view showing the state where the probe substrate and the supporting member of the probe card are engaged.
Figure 5:
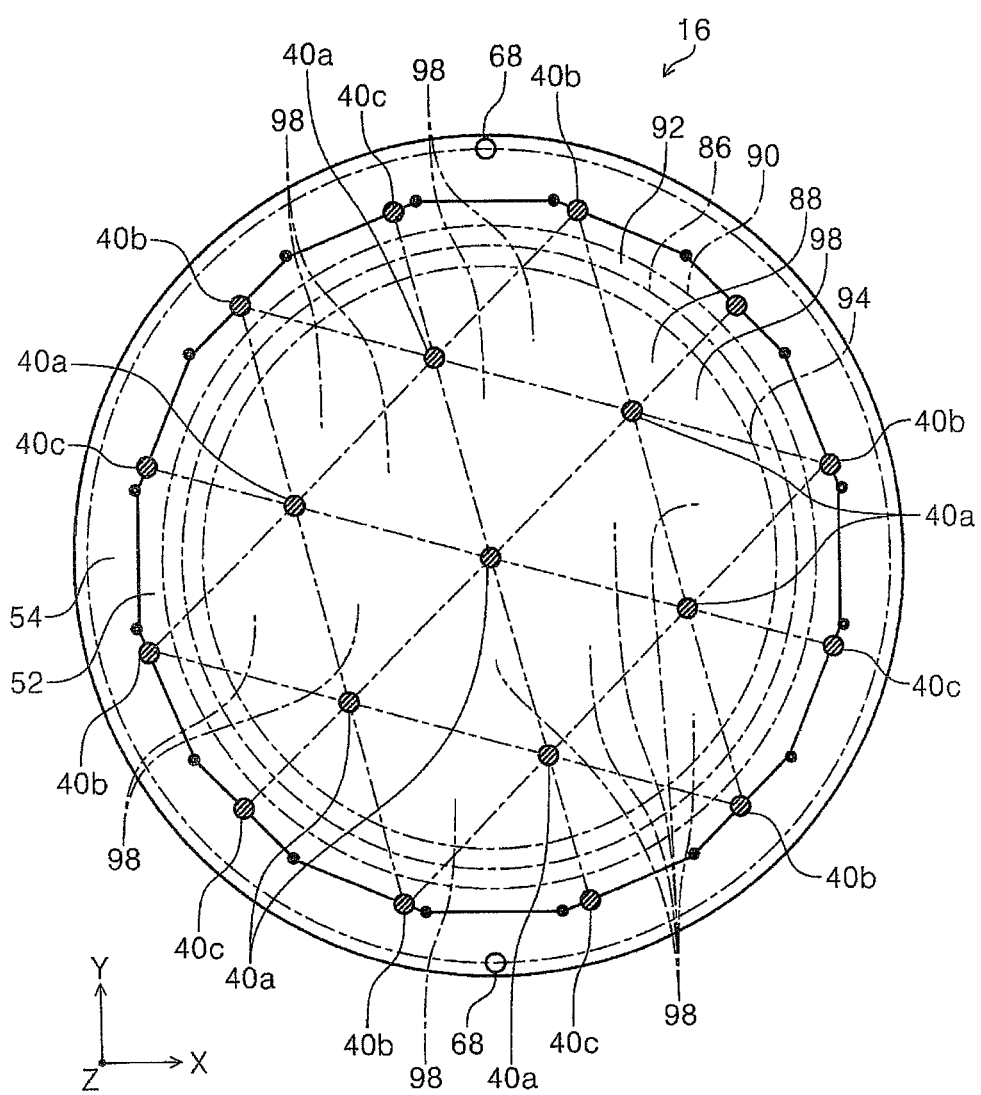
FIG. 5 is a plan view showing the arrangement of the anchor receiving portions on the probe card according to the first embodiment of the present invention.

The probe card 16 according to a first embodiment is described in detail with reference to FIGS. 3 through 5. The probe card 16 has the probe substrate 52 and the supporting body 54. In this embodiment, the probe substrate 52 has a disk-like (circular) shape, and is constituted as a multi-layer board (not shown) including a ceramic plate and a wiring board. The probe substrate 52 has the upper surface 36 and the under surface 32. The supporting body 54 is disposed on the outer periphery of the probe substrate 52.

The supporting body 54 is formed as an annular member, and serves as a height reference for the probe card 16 when the probe card 16 is attached to the prober 12. The supporting body 54 has a height reference member 56 and a probe substrate supporting portion 58. The height reference member 56 has a height reference portion 60 and a probe card clamping portion 62. An under surface 64 of the height reference portion 60 is attached to the prober 12. The under surface 64 is a height reference surface of the probe card 16. A positioning hole 68 is formed in the height reference portion 60 to insert a positioning pin 66 to the prober 12 for determining the position of the probe card 16 relative to the prober 12. (Refer to FIGS. 1, 4, and 5.)

A positioning pin 72 to be fitted into a recess 70 on the probe substrate 52 is provided on the under surface of the probe card clamping portion 62 to protrude from the under surface. Also, a through hole 74 is formed in the probe card clamping portion 62, and a screw member 76 is inserted in the through hole 74.

The annular-shaped probe substrate supporting portion 58 has a joining portion 78 and clamping bit 80. An internal thread 82 to be screwed with the screw member 76 is provided in the joining portion 78. The clamping bit 80 is provided to form a ring supporting the outer periphery of the under surface 32 of the probe substrate 52.

As the positioning pin 72 is fitted into the recess 70, the upper surface 36 of an outer periphery 84 of the probe substrate 52 is in contact with the probe card clamping portion 62 of the height reference member 56. Further, under surface 32 of the outer periphery 84 of the probe substrate 52 is in contact with the clamping bit 80 of the probe card clamping portion 62. In other words, the outer periphery 84 of the probe substrate 52 is clamped between the probe card clamping portion 62 and the clamping bit 80, when the screw member 76 inserted into the through hole 74 of the probe card clamping portion 62 is screwed with the internal thread 82 of the joining portion 78.

In addition, the probe substrate 52 has the plurality of probes 34 protruding from the under surface 32. The plurality of probes 34 are attached to the under surface 32 so that the flatness of the hypothetical plane obtained by connecting the tips of the probes 34 is equal to or smaller than the predetermined value (30 µm or less, for instance).

Also, a plurality of terminals 87 (refer to FIG. 6) coming in touch with the pogo pins 38 respectively are provided in the region inside a hypothetical circle 86 (refer to FIG. 5) which corresponds to the existence region of the pogo pins 38 on the pogo pin block 18. In other words, the internal area of the hypothetical circle 86 are defined as a terminal existence region 88. Also on the upper surface 36, a sealing member contact region 92 (refer to FIG. 5 and FIG. 7) is formed in the region between the hypothetical circle 86 and a hypothetical circle 90 which is concentric with the hypothetical circle 86 by coating the region with polyimide, for instance. In this embodiment, probes 34 are provided in a region on the under surface 32 which corresponds to the region inside a hypothetical circle 94. Namely, the internal area of the hypothetical circle 94 is a probe existence region 96 (refer to FIG. 5).

The plurality of anchor receiving portions 40a, 40b, 40c are formed on the upper surface 36. In this embodiment, the anchor receiving portions 40a, 40b, 40c are formed into a cylindrical shape. The plurality of anchor receiving portions 40a are disposed within the probe existence region 96. One of the anchor receiving portions 40a is disposed in the center position of the probe substrate 52. Six (6) anchor receiving portions 40a are disposed to surround the anchor receiving portion 40a disposed in the center position. The anchor receiving portions 40a are disposed in a manner that distances between each of the anchor receiving portions 40a and the neighboring anchor receiving portions 40a are equal. Namely, the seven (7) anchor receiving portions 40a are disposed regularly to form a regular hexagon having a base point at the anchor receiving portion 40a located in the center.

The three (3) neighboring anchor receiving portions 40a, when connected with each other by a hypothetical line, form a region enclosed by the three (3) neighboring anchor receiving portions 40a, namely a unit shape 98 having an equilateral triangle shape. Further in this embodiment, the plurality of anchor receiving portions 40b, 40c, disposed at equal distance from each other, are formed along the boundary of the probe substrate 52 and the supporting body 54.

The anchor receiving portions 40b are disposed in a manner that the distance to the neighboring two (2) anchor receiving portions 40a is equal to the length of one side of the equilateral triangle unit shape 98. Thus, the region enclosed by the one (1) anchor receiving portion 40b and the two (2) anchor receiving portions 40a also forms the unit shape 98 having an equilateral triangle shape. This means that two (2) or more equilateral triangle unit shapes 98 are disposed in a radial fashion from the center of the probe substrate 52.

The respective anchor receiving portions 40a, 40b, 40c are formed in the positions corresponding to the anchor portions 42 on the reference body 22. However, the corresponding positions are the positions where at least part of the abutting surface of the anchor receiving portions 40a, 40b, 40c overlaps with the anchor portions 42. Thus, the positions of the axis of the anchor receiving portions 40a, 40b, 40c (on the X-Y plane in FIG. 5) and the positions of the axis of the anchor portions 42 do not have to coincide completely, but may be displaced within the range where at least part of the abutting surface of the anchor receiving portions 40a, 40b, 40c overlaps with the anchor portions 42.

In this embodiment, seven (7) anchor receiving portions 40a are disposed within the terminal existence region 88. Thus, the number of anchor receiving portions can be reduced in comparison with the number of anchor receiving portions 100a, 100b in the related art, which is twelve (12). In other words, the area within the terminal existence region 88 occupied by the anchor receiving portions can be reduced, and the number of terminals 87 corresponding to the pogo pins 38 can be increased in proportion to the area reduced. As a result, the number of signal wires to the probe 34 can be increased to achieve the improved inspection performance of the inspection device 10.

Also in this embodiment, one of the anchor receiving portions 40a is disposed in the center of the probe substrate 52. This means that the center of the probe substrate is supported by the anchor to improve the rigidity of the probe substrate, and the deflection of the probe substrate 52 is restrained. In this way, the flatness of the hypothetical X-Y plane obtained by connecting the tips of the probes 34 provided on the under surface 32 of the probe substrate 52, is restrained from becoming worse than the prescribed flatness (30 µm or less, for instance).

Figure 6:
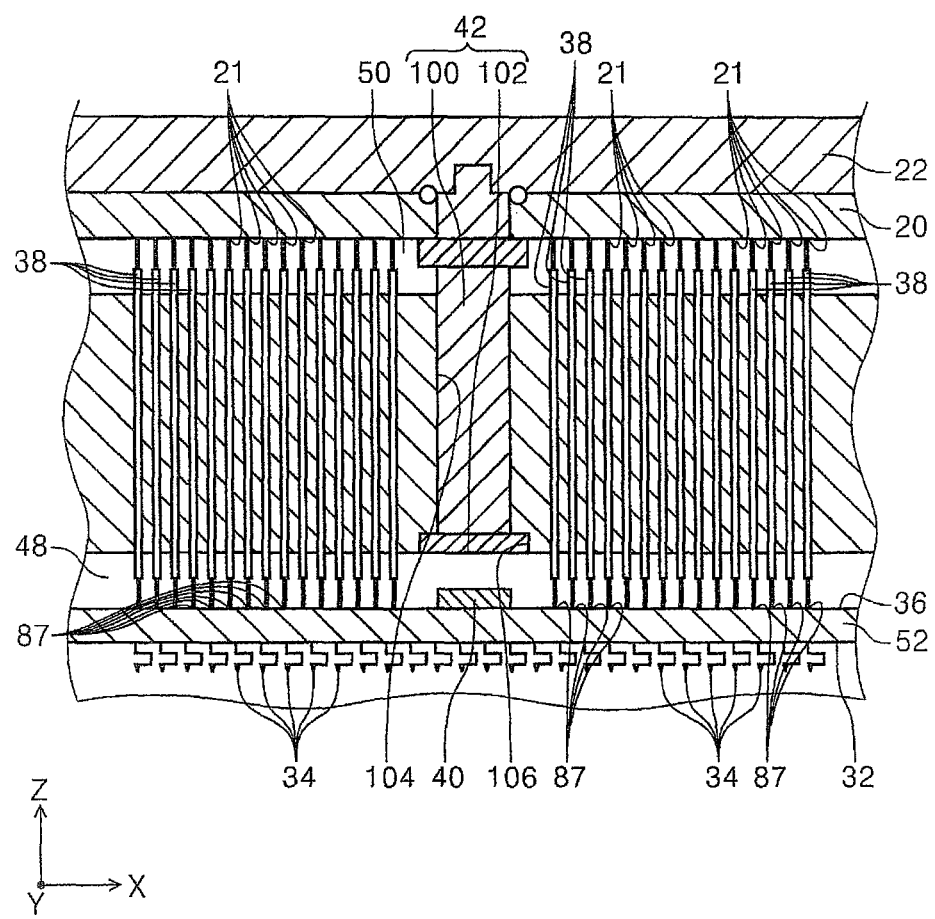
FIG. 6 is a side view showing the state where the pogo pins are in touch with the probe substrate and the reference body.

Next, the anchor portions 42 provided on the under surface side of the reference body 22 is described in detail with reference to FIG. 6 and FIG. 7. In FIG. 6, the anchor receiving portion 40 formed on the upper surface 36 of the probe substrate 52 and the anchor portion 42 provided on the under surface side of the reference body 22 are in the non-abutting state. The anchor portion 42 protrudes from the under surface of the reference body 22, and includes a cylindrical portion 100 and an expanded portion 102. The cylindrical portion 100 is provided in the pogo pin block 18 and is inserted in a through hole 104 which is vertically penetrating the pogo pin block 18. Diameter of the through hole 104 is expanded in the lower end portion to form an expanded diameter portion 106 which is capable of receiving the expanded portion 102.

Thus, in FIG. 6, the pogo pin block 18 is in a state that the expanded portion 102 of the anchor portion 42 is fitted into the expanded diameter portion 106 to make contact, and that the pogo pin block 18 is pulled toward the reference body 22 to make the pogo pins 38 pressed onto the wiring board 20. Preferably, the intensity of force pressing the pogo pins 38 against the wiring board 20 is designed and adjusted so that the pogo pins 38 are just pressed lightly against the wiring board 20 without causing any deflection of the wiring board 20.

FIG. 6 shows the state in which the tester 14 is displaced toward the probe card 16 until the lower ends of the pogo pins 38 touch the terminals 87 on the probe substrate 52. It should be noted that in this state, the pressing load exerted on both upper ends and lower ends of the pogo pins 38 is smaller than the load required to make contact, and electrical connection from the probes 34 to the tester 14 is unstable due to the insufficient pressing load.

At this point, the sealing member 44 provided on the outer periphery of the upper surface of the pogo pin block 18 comes in touch with the wiring board 20. Then, the space 50 enclosed by the sealing member 44 is formed between the upper surface of the pogo pin block 18 and the under surface of the reference body 22. Also, the sealing member 44 provided on the outer periphery of the under surface of the pogo pin block 18 comes in touch with the sealing member contact region 92. Then, the space 48 enclosed by the sealing member 44 is formed between the upper surface 36 of the probe substrate 52 and the under surface of the pogo pin block 18. It is preferable to make the space 50 and the space 48 communicate with each other to form a single space via a space within the pogo pins 38 and a through hole (not shown) provided on the pogo pin block 18 to penetrate from the upper surface to the under surface.

At this point, evacuation of the spaces located on the upper surface and on the under surface of the pogo pin block 18, namely the spaces 48, 50 formed with the wiring board 20 and the probe substrate 52 by the sealing member 44 provided on the pogo pin block 18, is initiated using an air supply and exhaust means which is not shown.

The pressure in the sealed spaces 48, 50 become lower relative to the outside atmospheric pressure, as the evacuation is progressed. Due to the pressure difference relative to the outside atmospheric pressure, the wiring board 20 and the probe substrate 52 are compressed in such direction that they come closer to each other toward the pogo pin block 18. Eventually, the abutting surface of the anchor portion 42 on the reference body 22 abuts on the abutting surface of the anchor receiving portion 40 on the probe substrate 52, as shown in FIG. 7. At this point, the pogo pin block 18 is positioned between the probe substrate 52 and the wiring board 20 in the direction of Z axis, receiving the reaction force from the wiring board 20 which is generated by the upper end of the pogo pins 38 pressed against the wiring board 20, and receiving the reaction force from the probe substrate 52 generated by the lower end of the pogo pins 38 pressed against the probe substrate 52 (State 1).

It should be noted that in this state, the upper ends and the lower ends of the pogo pins 38 are pressed with the prescribed load value against the terminals 87 on the probe substrate 52 and the terminals 21 on the wiring board 20 respectively, and electrical connection from the probe 34 to the tester 14 becomes stable. Thus, the probe card 16 is supported by the reference body 22 via the anchor receiving portions 40 and the anchor portions 42. Consequently, the relative positioning of the probe card 16 and the reference body 22 is defined, and the flatness of the probe card 16 follows the flatness of the reference body 22. In this state, the force from the outside atmospheric pressure caused by the decompression in the spaces 50, 43 at the wiring board 20 and the probe substrate 52 respectively, and the force toward the outside which is resisting and trying to push back the pogo pins 38 as the pogo pins 38 are pressed-in, are generally balanced in the probe existence region. For this reason, there is little possibility for the wiring board 20 and the probe substrate 52 to warp inward or outward.

As the evacuation is progressed further from the State 1, the air supply and exhaust means (now shown) maintains the negative pressure in the spaces 48, 50 at a constant value once the negative pressure in the spaces 48, 50 measured by a measuring means, which is not shown, reaches the prescribed value (State 2). In the State 2, the spaces 48, 50 are made into low pressure chamber and the pogo pins 38 are pressed-in by the probe card 16 and the wiring board 20, which makes the anchor receiving portions 40 abutted on the anchor portions 42. (State 1), and additionally the probe card 16 is integrated with the reference body 22 via the anchor portions 42 due to the newly generated differential pressure.

When the space 48 enters into the negative pressure state as it goes beyond the State 1 or the balanced state, the force caused by the atmospheric pressure is exerted on the probe substrate 52 from the under surface 32, trying to displace the probe substrate 52 toward the pogo pin block 18. At this point, the probe substrate 52 is supported by the plurality of anchor portions 42, and receives the aforementioned force by the regions having the same area, that is the plurality of equilateral triangle unit shapes 98.

Since the plurality of equilateral triangle unit shapes 98 are formed so that each of the equilateral triangle unit shapes 98 has an equal area, equal amount of force is exerted on each equilateral triangle unit shape 98. This means no difference is created with regard to the force exerted on each unit shape 98, and the amount of displacement of the probe substrate 52 toward the pogo pin block 18 is equal in the entire area. Consequently, the deflection of the probe substrate 52 is restrained.

In addition, the equilateral triangle unit shape 98 allows reduction of the number of vertexes to the smallest number among the regular polygons that have constant distance from each vertex to the center of gravity.

This can be proved as follows: When a distance from each vertex to the center of gravity is "a",
The area "S" of a regular n-sided polygon can be expressed by the following equation:

$$S = n \cdot a^2 \cdot \{\cos(\pi/n) \cdot \sin(\pi/n)\}$$

Interior angles of a regular-n-sided polygon (rad.) can be expressed as follows:

$$\pi(n-2)/n$$

and the sum of the interior angles of an n-sided polygon can be expressed by the following:

$$\pi(n-2)$$

Thus, the number of geometric vertex occupied by an n-sided polygon, namely the number of anchors N can be expressed by the following equation:

$$N = \pi(n-2)/2\pi = (n-2)/2$$

Thus, the value obtained by dividing the area "S" by the number of anchors in it, namely the area "s" per an anchor, when the distances between each vertex and the center of gravity is kept constant, can be expressed as follows:

$$s = S/N = n \cdot a^2 \cdot \{\cos(\pi/n) \cdot \sin(\pi/n)\}/\{(n-2)/2\}$$

$$= 2n \cdot a^2 \cdot \{\cos(\pi/n) \cdot \sin(\pi/n)/(n-2)\}$$

Based on this equation,
$s = 2.598a^2$, when n=3, namely in the case of equilateral triangle.
Similarly,
$s = 2a^2$, when n=4, namely in the case of square,
$s = 1.585a^2$, when n=5, namely in the case of equilateral pentagon, and
$s = 1.299a^2$, when n=6, namely in the case of regular hexagon.
In this way, the area per an anchor decreases as "n" is increased.

When an uniform pressure is exerted from the surface opposite to the anchor on an elastic body with anchors disposed at the vertexes of the regular polygons, a center of gravity position that is farthest from the anchors is the point where the largest displacement takes place within the regular polygon geometry. However, if the distances from the vertexes of the regular polygon are equal, the amount of displacement will be equal in general. Thus, for the equal unit area, the smallest number of anchors is required when the unit shape is formed as an equilateral triangle. In other words, when the areas are equal, the amount of displacement at the center of gravity becomes smaller when the anchors are disposed on the vertexes of regular polygon with smaller number of sides.

In addition, the reaction force of the pogo pins 38 against the pressurizing force of the atmospheric pressure from the under surface 32 is exerted on the probe substrate 52 within the probe existence region 96 of the probe substrate 52. In addition, the reaction force from the sealing member 44 that comes in touch with the probe substrate 52 within the sealing member contact region 92 is exerted on the periphery of the probe substrate 52, namely on the outside of the probe existence region 96. Thus, the reaction force against the atmospheric pressure exerted on the under surface 32, namely the reaction force of the pogo pins 38 and the sealing member 44 is exerted on the upper surface 36 within the existence regions of pogo pins 38 and the sealing member 44 extending from the center position toward the outer periphery in the radial direction. This enables to reduce the deflection of the probe substrate 52 in the radial direction.

Second Embodiment

Figure 8:
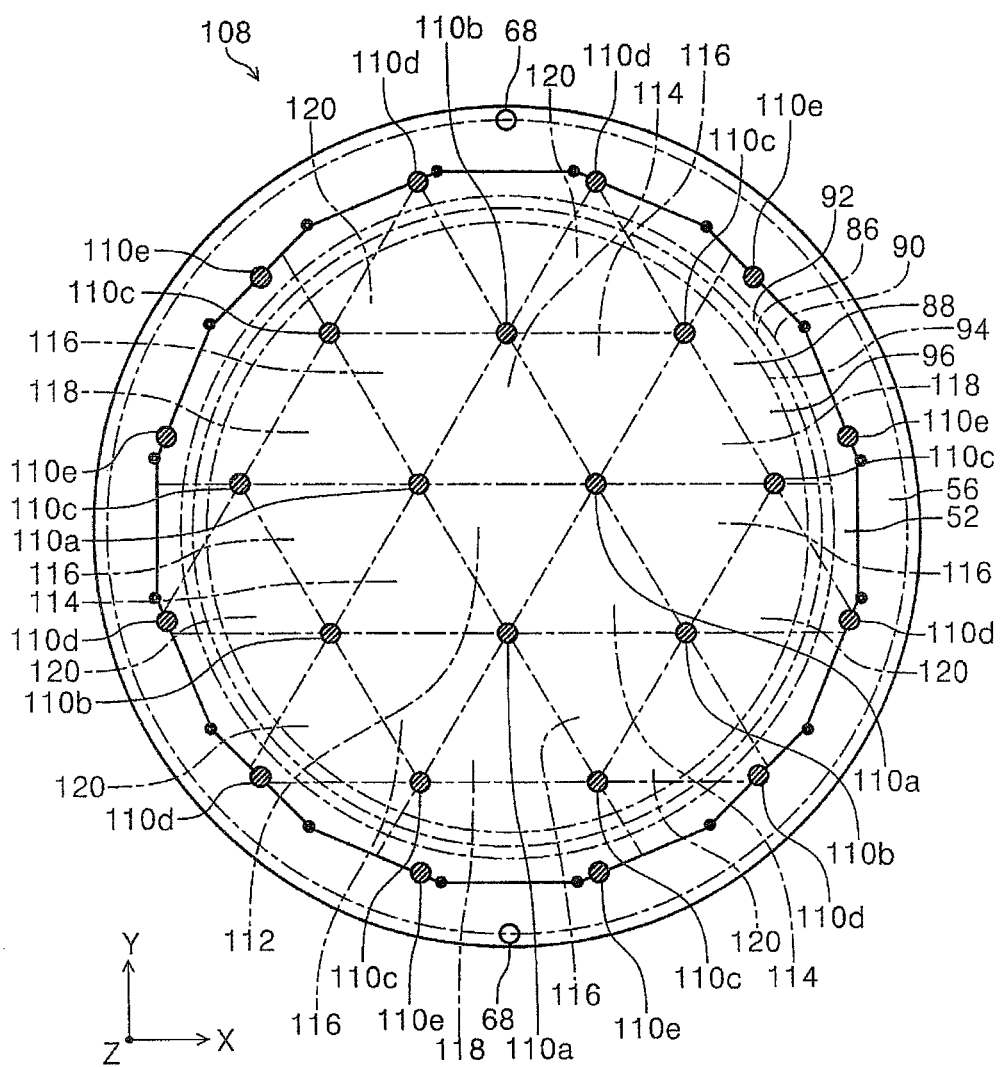
FIG. 8 is a plan view showing the arrangement of the anchor receiving portions on the probe card according to the second embodiment of the present invention.

The probe card 108 according to a second embodiment is described with reference to FIG. 8. The second embodiment differs from the first embodiment in terms of the positions of anchor receiving portions 110 relative to the anchor receiving portions 40 on the probe substrate 52 in the first embodiment, and also differs in terms of the unit shape area that is smaller than the first embodiment to enhance the rigidity of the probe substrate 52.

In the probe card 108, a plurality of anchor receiving portions 110a, 110b, 110c, 110d, 110e are provided on the upper surface 36 of the probe substrate 52. Three (3) anchor receiving portions 110a are disposed in a manner that distances between anchor receiving portions 110a are equal. In addition, the three (3) anchor receiving portions 110a are disposed in a manner that the center of gravity of a unit shape 112 having an equilateral triangle shape and formed by the three (3) anchor receiving portions 110a corresponds to the center of the probe substrate 52.

Further, unit shapes 114 each having an equilateral triangle shape are disposed around the unit shape 112 having an equilateral triangle shape, in a manner that the unit shapes 114 share one side with the equilateral triangle unit shape 112 with the dimensions being equal to the equilateral triangle unit shape 112. Among the three (3) vertexes constituting each of the equilateral triangle unit shapes 114, two (2) vertexes are formed by the anchor receiving portions 110a, and the remaining one is formed by the anchor receiving portion 110b.

Further, equilateral triangle unit shapes 116 are disposed around the equilateral triangle unit shapes 114 in a manner that the unit shapes 116 share one side with the equilateral triangle unit shape 114 with the dimensions being equal to the equilateral triangle unit shapes 112, 114. Among the three (3) vertexes constituting each of the equilateral triangle unit shapes 116, one vertex is formed by the anchor receiving portion 110a, and one of other vertexes is formed by the anchor receiving portion 110b. The anchor receiving portion 110c is disposed on the remaining vertex.

For the equilateral triangle unit shapes 118 located between the two (2) equilateral triangle unit shapes 116, one of the three (3) vertexes of the equilateral triangle is formed by the anchor receiving portion 110a, and the remaining two (2) vertexes are formed by the anchor receiving portions 110c. In the equilateral triangle unit shapes 118, the two (2) sides connecting the anchor receiving portion 110a and the anchor receiving portions 110c respectively shares one of the sides of the neighboring equilateral triangle unit shapes 116. Thus, the anchor receiving portions 110a, 110b, 110c are disposed regularly and at equal distances to the anchor receiving portions 110a, 110b, 110c which are neighboring with each other within the probe existence region 96 on the probe substrate 52.

In addition, in each of the six (6) equilateral triangle unit shapes 116 on the probe substrate 52, one side located outward in radial direction, namely the side not shared with the equilateral triangle unit shapes 114, 118, is in common with one side of equilateral triangle unit shapes 120. Among the three (3) vertexes in the equilateral triangle unit shapes 120, one vertex is formed by the anchor receiving portion 110b, and one of other vertexes is formed by the anchor receiving portion 110c. The anchor receiving portion 110d is disposed on the remaining vertex.

Also in this embodiment, a plurality of anchor receiving portions 110e are disposed on the circumference of a circle with its radius corresponding to the distance from the center of the probe substrate 52 to the position of the anchor receiving portion 110d. The anchor receiving portions 110d and 110e are disposed at equal intervals on the circumference of the circle.

Each of the anchor receiving portions 110a, 110b, 110c, 110d in this embodiment are positioned at equal distances. Also, the equilateral triangle unit shapes 112, 114, 116, 118, 120 are formed to have the same dimensions with each other. In other words, the equilateral triangle unit shapes 112, 114, 116, 118, 120 have equal areas.

In this embodiment, the equilateral triangle unit shapes 112, 114, 116, 118, composed with the anchor receiving portions 110 having equal areas are formed within the probe existence region 96 on the probe substrate 52. Thus, when the force causing deflection on the probe substrate 52 is applied to the probe substrate 52, the force is exerted equally on all equilateral triangle unit shapes 112, 114, 116, 118. This means no difference is caused regarding the force exerted on each unit shape, and the difference in the amount of deflection among the unit shape can be restricted. Consequently, the flatness of the probe substrate 52 can be maintained to be equal to or smaller than the predetermined value (30 μm or less, for instance).

Further in this embodiment, the total number of equilateral triangle unit shapes 112, 114, 116, 118 within the probe existence region 96 is increased to 13 in comparison with the case of the first embodiment in which the number of equilateral triangle unit shapes 98 is 6. This means that the unit area supported by each of the anchor receiving portions 110a, 110b, 110c becomes smaller, and the deflection generated on the probe substrate 52 is restricted.

Third Embodiment

Figure 9:
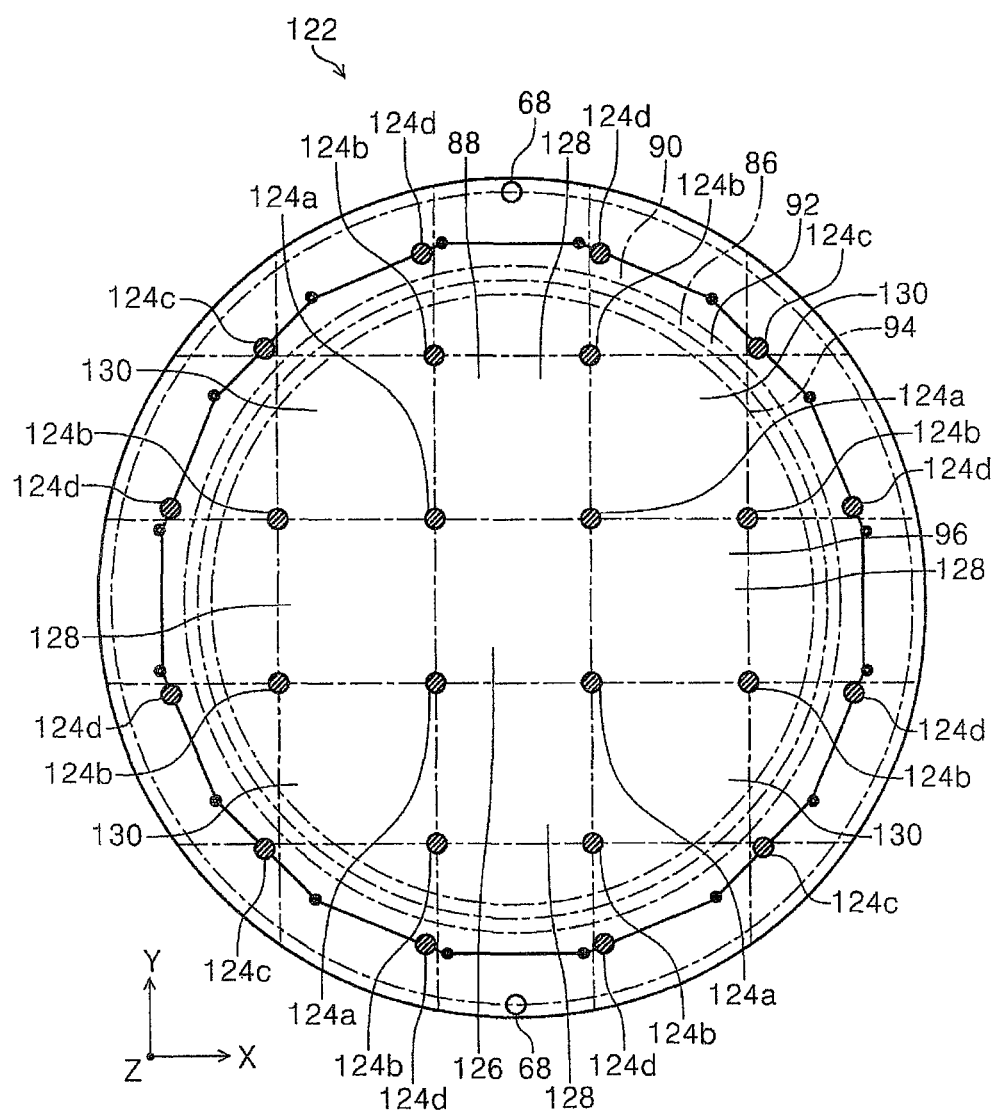
FIG. 9 is a plan view showing the arrangement of the anchor receiving portions on the probe card according to the third embodiment of the present invention.
Figure 10:
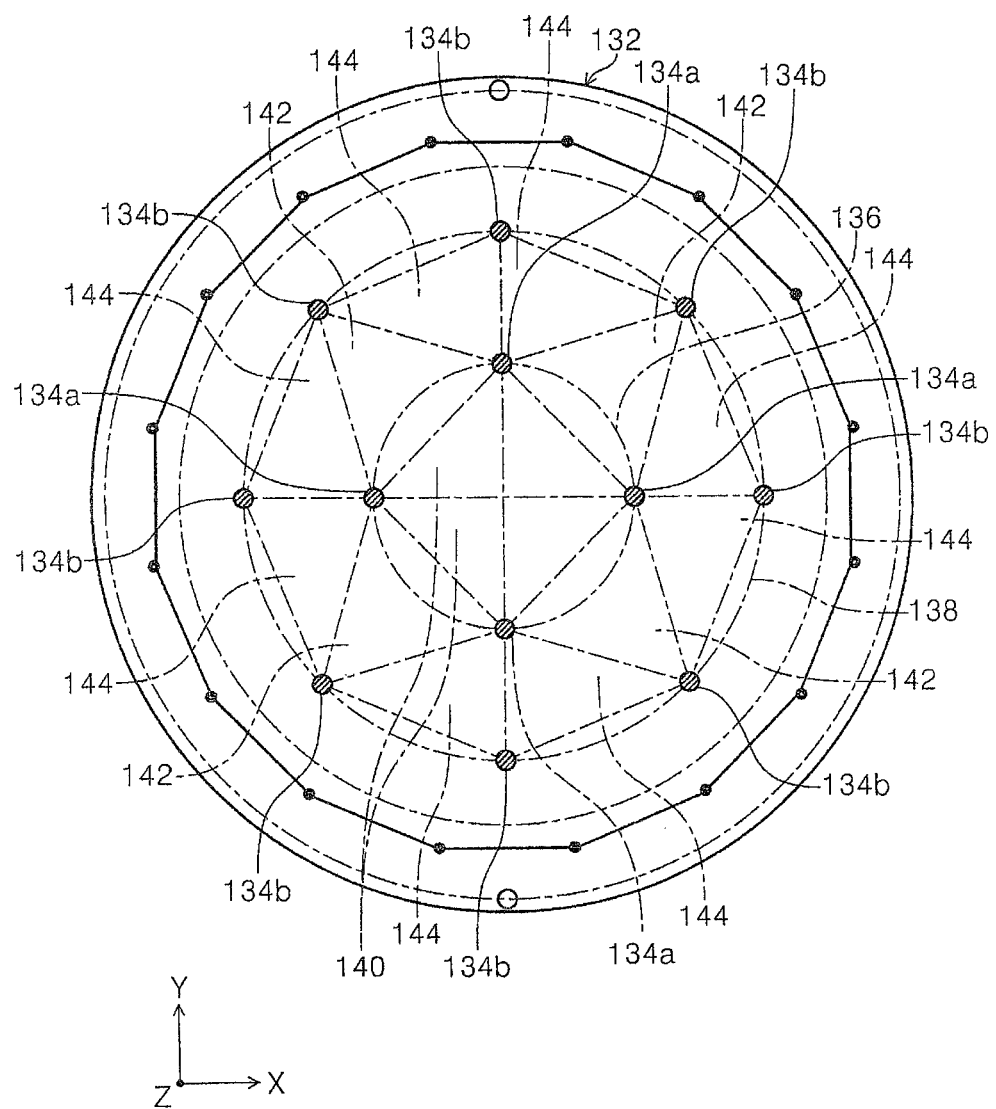
FIG. 10 is a plan view showing the arrangement of the anchor receiving portions on the conventional probe card.

The probe card 122 according to a third embodiment is described with reference to FIG. 9. The third embodiment differs from the first embodiment in terms of the positions of anchor receiving portions 124 relative to the anchor receiving portions 40 on the probe substrate 52 in the first embodiment.

In the probe card 122, a plurality of anchor receiving portions 124a, 124b, 124c, 124d are provided on the upper surface 36 of the probe substrate 52. Four (4) anchor receiving portions 124a are disposed in a manner that distances from the center of the probe substrate 52 are equal. Further, the four (4) anchor receiving portions 124a are disposed so that the distances between the neighboring anchor receiving portions 124*a* are equal. Namely, the four (4) anchor receiving portions 124*a* forms a square unit shape 126.

Square unit shapes 128 sharing one side of the square unit shape 126 are disposed on the four (4) sides of the square unit shape 126. Among the four (4) vertexes of the square unit shape 128, two (2) vertexes are formed by the anchor receiving portions 124*a*, and the remaining two (2) vertexes are formed by the anchor receiving portions 124*b*. Namely, the anchor receiving portions 124*a*, 124*b* are disposed regularly and at equal distances to the neighboring anchor receiving portions 124*a*, 124*b* within the probe existence region 96 on the probe substrate 52.

Square unit shapes 130 are disposed between the two (2) square unit shapes 128 having one side to be shared with each of the two (2) sides of the square unit shape 126, which meet at right angles. The two (2) sides of the square unit shapes 130 meeting at right angles are shared respectively with one side of the square unit shapes 128.

Also, anchor receiving portions 124*c*, 124*d* are disposed on the boundary of the probe substrate 52 and the supporting body 54 on the probe card 122. The anchor receiving portions 124*c*, 124*d* are disposed in a manner that the distances to the anchor receiving portions 124*c*, 124*d* neighboring on the same circle are equal. Also, the anchor receiving portions 124*c* are disposed in the vicinity of intersections where two sides of the square unit shapes 130, not shared with the square unit shapes 128, meet.

Also, the square unit shapes 126, 128, 130, are formed to have the same dimensions with each other. In other words, the square unit shapes 126, 128, 130 have equal areas.

In this embodiment, the square unit shapes 126, 128 composed with the anchor receiving portions 124 having equal areas are formed within the probe existence region 96 on the probe substrate 52. Thus, when the force causing deflection on the probe substrate 52 is applied to the probe substrate 52, the force is exerted equally on all square unit shapes 126, 128. This means no difference is caused regarding the force exerted on each unit shape, and the difference in the amount of deflection among the unit shape can be restricted. Consequently, the flatness of the probe substrate 52 can be maintained to be equal to or smaller than the predetermined value (30 μm or less, for instance).

In addition, disposing the anchor receiving portions 124 using the square unit shape 126 allows the repetitions of the signal wires, etc. in vertical or horizontal direction that matches the direction of semiconductor chip arrangement. This is preferable in many cases because it contributes to easy arrangement in the course of probe card production. Although such arrangement does not have advantages in terms of flatness preservation equivalent to that of equilateral triangle unit shape, but has advantage that no other regular polygons can provide.

Modifications of the First Through Third Embodiments (1) The first through the third embodiments are formed in a manner that the anchor portions 42 are abutted on the anchor receiving portions 40 and a negative pressure is created in the spaces 48, 50 so that the probe card 16 is supported by the reference body 22. Alternatively, they may be formed in a manner that an external screw is provided at each of the tip of the anchor portions 42, and an internal thread is provided on each of the anchor receiving portions 40, so that the probe card 16 is supported by the reference body 22 by screwing the anchor portions 42 with the anchor receiving portions 40.

(2) The first through the third embodiments are formed to provide the sealing member contact region 92 on the outer peripheral portion of the upper surface 36 of the probe substrate 52. Alternatively, the sealing member 44 may be provided on the outer periphery of the upper surface 36.

(3) In the first through the third embodiments, the anchor receiving portion 40, 110, 124 are disposed at equal distances on the boundary of probe substrate 52 and the supporting body 54. Alternatively, the anchor receiving portion 40, 110, 124 may be disposed at irregular distances on the boundary of probe substrate 52 and the supporting body 54.

(4) Besides the constitution in which the unit shapes are formed by equilateral triangles or squares, the unit shapes may be formed by regular polygons or by the combination of these shapes.

(5) The first through the third embodiments are formed by disposing the anchor receiving portions 40*a*, 110, 110*a*, 110*b*, 110*c*, 124, 124*a*, 124*b* regularly and at equal distances from each other within the probe existence region 96 of the probe substrate 52. Alternatively, at least one anchor receiving portion 146 may be disposed within the probe existence region 96 in addition to these anchor receiving portions. The at least one anchor receiving portion 146 may be disposed in such manner that the irregular distances to the neighboring anchor receiving portions 40*a*, 110, 110*a*, 110*b*, 110*c*, 124, 124*a*, 124*b* are different from the distance between each of the anchor receiving portions 40*a*, 110, 110*a*, 110*b*, 110*c*, 124, 124*a*, 124*b*.

Also, the unit shapes 98, 112, 114, 116, 118, 126, 128 formed by the anchor receiving portions 40*a*, 110, 110*a*, 110*b*, 110*c*, 124, 124*a*, 124*b* within the probe existence region 96 may be formed in such a manner that the at least one anchor receiving portion 146 is provided in at least one of the unit shapes 98, 112, 114, 116, 118, 126, 128.

Figure 11:
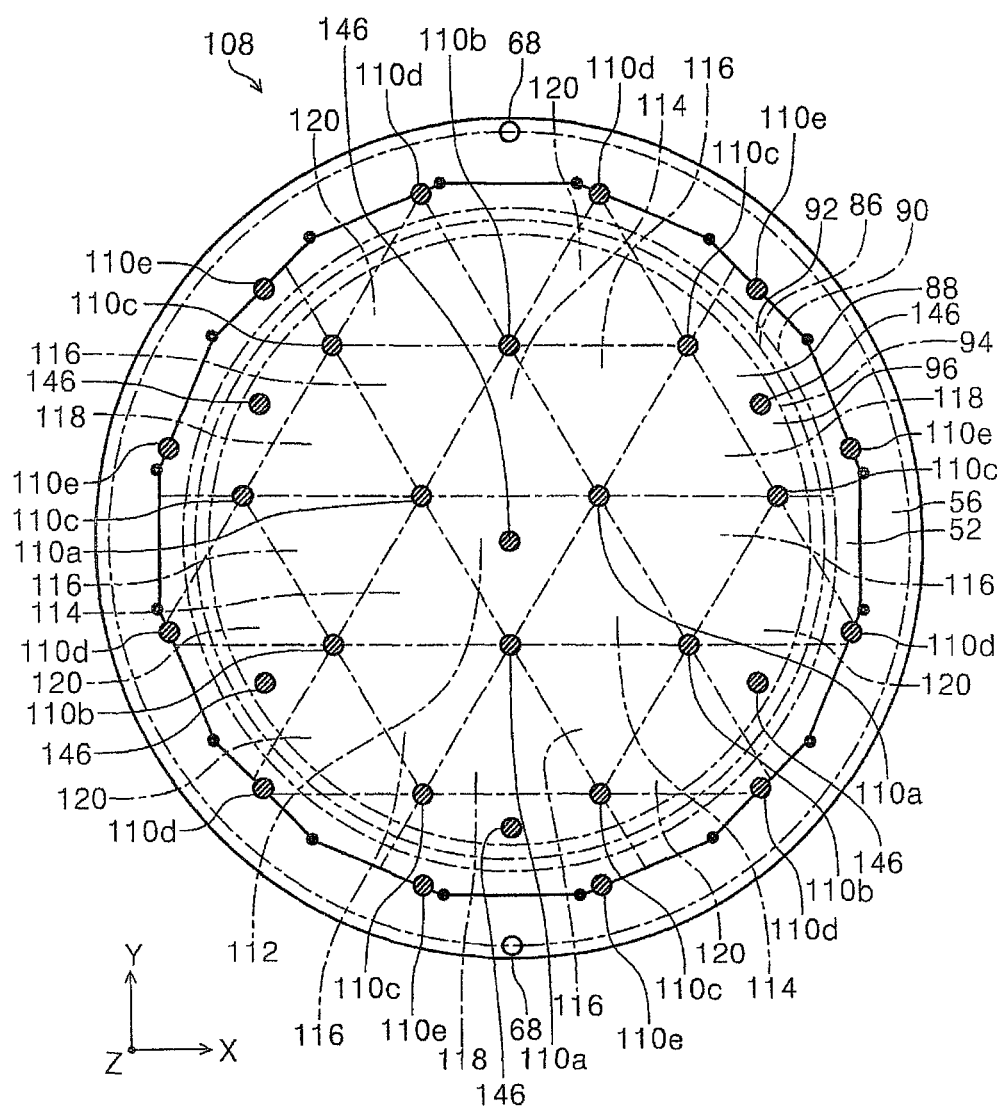
FIG. 11 is a plan view showing the arrangement of the anchor receiving portions on the probe card according to a modification of the second embodiment of the present invention.
Figure 12:
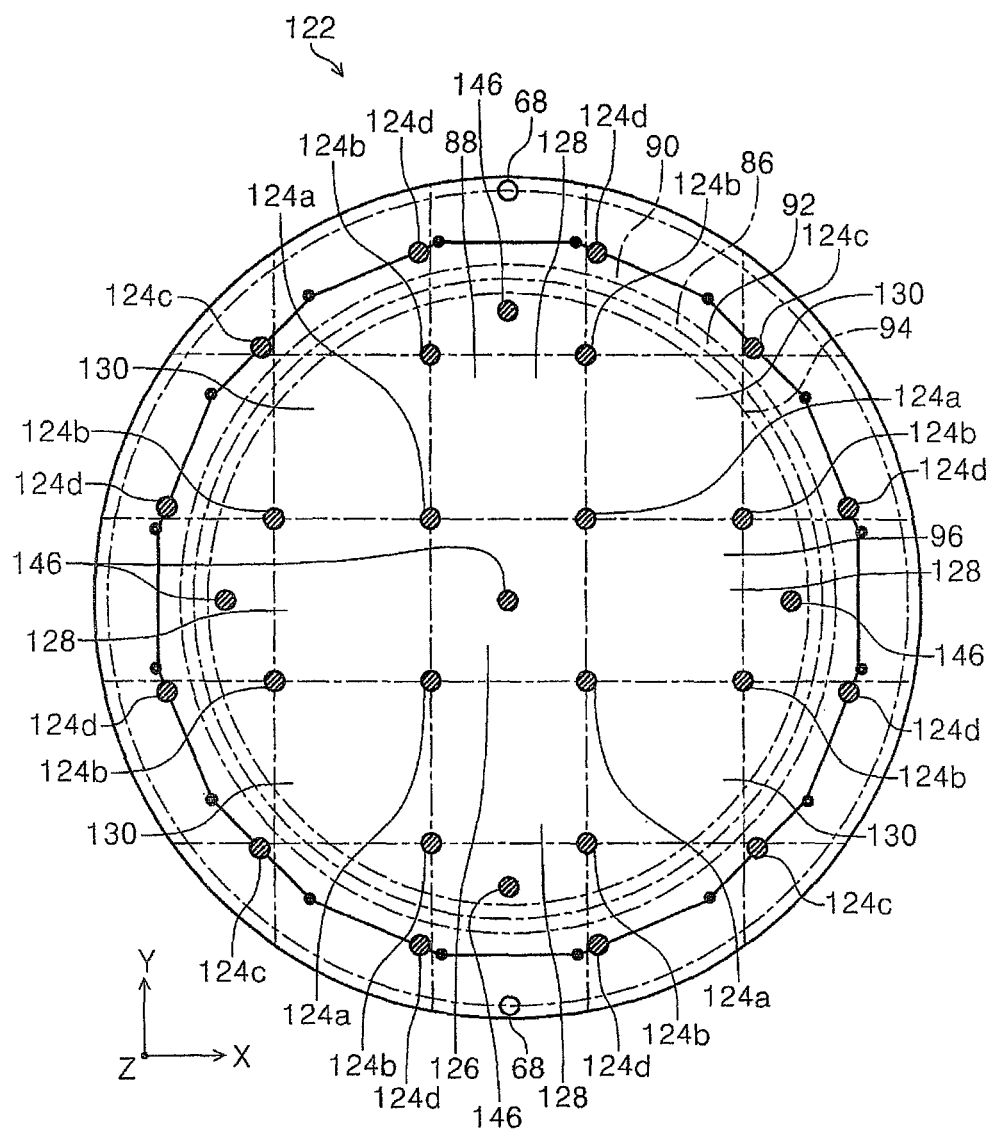
FIG. 12 is a plan view showing the arrangement of the anchor receiving portions on the probe card according to a modification of the third embodiment of the present invention.

Examples of arrangement regarding the at least one anchor receiving portion 146 are shown in FIG. 11 and FIG. 12. Examples of arrangement for the anchor receiving portions 146 include provision of the anchor receiving portion 146 in the center of probe substrate 52, at a position within the probe existence region 96 where none of the unit shapes 98, 112, 114, 116, 118, 126, 128 is formed, or at a position within the probe existence region 96 where the unit shapes 98, 112, 114, 116, 118, 126, 128 are formed.

In the examples of arrangement for the at least one anchor receiving portions 146 shown in FIG. 11 and FIG. 12, the unit shapes 112, 114, 116, 118, 126, 128 are formed within the probe existence region 96 and the same amount of force is exerted on each unit shape. Thus, addition of the at least one anchor receiving portion 146 within the probe existence region 96 would not cause any degradation regarding the flatness of the probe substrate 52.

The probe card 16, 108, 122 is the probe card 16, 108, 122 that comes in touch with the test object 30 to perform the testing, including: the probe substrate 52 provided with the plurality of probes 34 on the under surface 32 and the plurality of anchor receiving portions 40, 110, 124 on the upper surface 36; and the supporting body 54 disposed to support the periphery of the probe substrate 52, with at least the plurality of anchor receiving portions 40, 110, 124 located within the existence region 96 of the probes 34 being arranged regularly and at an equal distance from each other on the upper surface 36 of the probe substrate 52.

On the probe card 16, 108, 122, at least two (2) unit shapes among 98, 112, 114, 116, 118, 120, 126, 128, 130 exist, which are formed by the plurality of anchor receiving portions 40, 110, 124 disposed regularly and at equal distances in the radial direction from the center of probe substrate 52 and neighboring with each other.

On the probe card 16, 108, the unit shapes formed by the three (3) neighboring anchor receiving portions 40, 110 are the equilateral triangles 98, 112, 114, 116, 118, 120. On the probe card 122, the unit shapes formed by the four (4) neighboring anchor receiving portions 124 are the squares 126, 128, 130. On the probe card 16, one of the plurality of anchor receiving portions 40 is disposed in the center of the probe substrate 52.

The probe card 16, 108, 122 includes: the plurality of terminals 87 coming in touch with the plurality of pogo pins 38 respectively on the upper surface 36 of the probe substrate 52; and the sealing member contact region 92 on the outside of the existing region 88 of the terminals 87 and on the inside of the outer periphery of the probe substrate 52 to form the low pressure chamber 48, 50. Also, the probe card 16, 108, 122 includes: the plurality of terminals 87 coming in touch with the plurality of pogo pins 38 respectively on the upper surface 36 of the probe substrate 52; and the sealing member 44 on the outside of the existing region 88 of the terminals 87 and on the inside of the outer periphery of the probe substrate 52 to form the low pressure chamber 48, 50.

In addition to the plurality of anchor receiving portions 40*a*, 110, 110*a*, 110*b*, 110*c*, 124, 124*a*, 124*b* disposed regularly and at equal distances from each other, the at least one anchor receiving portion 146 is provided within the existence region 96 of the probes 34 on the upper surface 36 of the probe substrate 52. The distances between the at least one anchor receiving portion 146 and the neighboring plurality of anchor receiving portions 40*a*, 110, 110*a*, 110*b*, 110*c*, 124, 124*a*, 124*b* are different from the distances between each of the plurality of anchor receiving portions 40*a*, 110, 110*a*, 110*b*, 110*c*, 124, 124*a*, 124*b*.

The inspection device 10 includes: the probe card 16, 108, 122; the pogo pin block 18 positioned on the side of upper surface 36 of the probe substrate 52 and provided with the plurality of pogo pins 38 electrically connected with terminals 87; the reference body 22 having the plurality of anchor portions 42 to be abutted on the anchor receiving portions 40, 110, 124 of the probe card 16, 108, 122, and defining the flatness of the probe card 16, 108, 122 when the anchor receiving portions 40, 110, 124 are abutted on the anchor portions 42; the wiring board 20 disposed between the pogo pin block 18 and the reference body 22 and having the plurality of terminals 21 individually connected electrically to the ends opposite to those coming in touch with the terminals 87 of the pogo pins 38; the prober 12 to which the probe card 16, 108, 122 is attached via the supporting body 54, and having the inspection stage 26 on which the test object 30 coming in touch with the probes 34 on the probe card 16, 108, 122 is placed; and the tester 14 to be connected electrically with the wiring board 20.

It goes without saying that the present invention is not limited to the above embodiments, and various modifications are possible within the scope of the invention set forth in the claims and such modifications are also included in the scope of the present invention.

What is claimed is:

1. A probe card to perform an inspection by coming in contact with a test object, comprising:
    a probe substrate having a first surface and a second surface;
    a plurality of probes arranged on the first surface;
    a plurality of anchor receiving portions arranged on the second surface;
    a supporting body disposed to abut and support a periphery of the probe substrate; and
    a probe existence region that is defined on the second surface of the probe substrate and contains anchor receiving portions, wherein
    those anchor receiving portions within the probe existence region are disposed regularly in such a manner that neighboring anchor receiving portions are arranged at substantially equal distances from each other,
    unit shapes are formed by a plurality of the neighboring anchor receiving portions, and
    each of the unit shapes has a substantially equal area.

2. The probe card according to claim 1, wherein at least two unit shapes are formed by the neighboring anchor receiving portions in a radial direction from a center of the probe substrate.

3. The probe card according to claim 2, wherein the unit shapes are formed by three neighboring anchor receiving portions and have an equilateral triangle shape.

4. The probe card according to claim 3, wherein at least one secondary anchor receiving portion is provided within the probe existence region on the second surface of the probe substrate, in addition to the plurality of neighboring anchor receiving portions disposed regularly and at an equal distance from each other, and
    a distance between the secondary anchor receiving portion and one of the plurality of neighboring anchor receiving portions is different from the distances between the plurality of anchor receiving portions.

5. An inspection device comprising:
    the probe card according to claim 3,
    a pogo pin block positioned on the second surface side of the probe substrate and provided with the plurality of pogo pins that are electrically connected with first terminals which are provided on the second surface of the probe substrate,
    a reference body having a plurality of anchor portions to be abutted on the anchor receiving portions of the probe card, and defining the flatness of the probe card when the anchor receiving portions are abutted on the anchor portions,
    a wiring board disposed between the pogo pin block and the reference body and having a plurality of terminals individually connected electrically to opposite sides to those coming in touch with the terminals of the pogo pins,
    a prober to which the probe card is attached via the supporting body, and having a stage on which the test object to come in touch with the probes on the probe card is placed, and
    a tester to be connected electrically with the wiring board.

6. The probe card according to claim 2, wherein the unit shapes are formed by four neighboring anchor receiving portions and have a square shape.

7. The probe card according to claim 6, wherein at least one secondary anchor receiving portion is provided within the probe existence region on the second surface of the probe substrate, in addition to the plurality of neighboring anchor receiving portions disposed regularly and at an equal distance from each other, and
    a distance between the secondary anchor receiving portion and one of the plurality of neighboring anchor receiving portions is different from the distances between the plurality of anchor receiving portions.

8. An inspection device comprising:
    the probe card according to claim 6, a pogo pin block positioned on the second surface side of the probe substrate and provided with the plurality of pogo pins that are electrically connected with first terminals which are provided on the second surface of the probe substrate, a reference body having a plurality of anchor portions to be abutted on the anchor receiving portions of the probe card, and defining the flatness of the probe card when the anchor receiving portions are abutted on the anchor portions, a wiring board disposed between the pogo pin block and the reference body and having a plurality of terminals individually connected electrically to opposite sides to those coming in touch with the terminals of the pogo pins, a prober to which the probe card is attached via the supporting body, and having a stage on which the test object to come in touch with the probes on the probe card is placed, and a tester to be connected electrically with the wiring board.

9. The probe card according to claim 2, wherein one of the plurality of anchor receiving portions is disposed in the center of the probe substrate.

10. The probe card according to claim 2, wherein a plurality of terminals which come in contact with a plurality of pogo pins individually are provided on the second surface of the probe substrate, and
a sealing member contact region is provided to form a low pressure chamber on the outside of a terminal existence region and inside of an outer periphery of the probe substrate.

11. The probe card according to claim 2, wherein a plurality of terminals which come in contact with the plurality of pogo pins individually are provided on the second surface of the probe substrate, and
a sealing member is provided to form a low pressure chamber on the outside of the terminal existence region and inside of an outer periphery of the probe substrate.

12. The probe card according to claim 2, wherein at least one secondary anchor receiving portion is provided within the probe existence region on the second surface of the probe substrate, in addition to the plurality of neighboring anchor receiving portions disposed regularly and at an equal distance from each other, and
a distance between the secondary anchor receiving portion and one of the plurality of neighboring anchor receiving portions is different from the distances between the plurality of anchor receiving portions.

13. An inspection device comprising:
the probe card according to claim 2,
a pogo pin block positioned on the second surface side of the probe substrate and provided with the plurality of pogo pins that are electrically connected with first terminals which are provided on the second surface of the probe substrate,
a reference body having a plurality of anchor portions to be abutted on the anchor receiving portions of the probe card, and defining the flatness of the probe card when the anchor receiving portions are abutted on the anchor portions,
a wiring board disposed between the pogo pin block and the reference body and having a plurality of terminals individually connected electrically to opposite sides to those coming in touch with the terminals of the pogo pins,
a prober to which the probe card is attached via the supporting body, and having a stage on which the test object to come in touch with the probes on the probe card is placed, and
a tester to be connected electrically with the wiring board.

14. The probe card according to claim 1, wherein one of the plurality of anchor receiving portions is disposed in the center of the probe substrate.

15. The probe card according to claim 1, wherein a plurality of terminals which come in contact with a plurality of pogo pins individually are provided on the second surface of the probe substrate, and
a sealing member contact region is provided to form a low pressure chamber on the outside of a terminal existence region and inside of an outer periphery of the probe substrate.

16. The probe card according to claim 1, wherein a plurality of terminals which come in contact with the plurality of pogo pins individually are provided on the second surface of the probe substrate, and
a sealing member is provided to form a low pressure chamber on the outside of the terminal existence region and inside of an outer periphery of the probe substrate.

17. The probe card according to claim 1, wherein at least one secondary anchor receiving portion is provided within the probe existence region on the second surface of the probe substrate, in addition to the plurality of neighboring anchor receiving portions disposed regularly and at an equal distance from each other, and
a distance between the secondary anchor receiving portion and one of the plurality of neighboring anchor receiving portions is different from the distances between the plurality of anchor receiving portions.

18. An inspection device comprising:
the probe card according to claim 1,
a pogo pin block positioned on the second surface side of the probe substrate and provided with the plurality of pogo pins that are electrically connected with first terminals which are provided on the second surface of the probe substrate,
a reference body having a plurality of anchor portions to be abutted on the anchor receiving portions of the probe card, and defining the flatness of the probe card when the anchor receiving portions are abutted on the anchor portions,
a wiring board disposed between the pogo pin block and the reference body and having a plurality of terminals individually connected electrically to opposite sides to those coming in touch with the terminals of the pogo pins,
a prober to which the probe card is attached via the supporting body, and having a stage on which the test object to come in touch with the probes on the probe card is placed, and
a tester to be connected electrically with the wiring board.

19. The probe card according to claim 1, wherein the supporting body has a probe substrate supporting portion and a probe card clamping portion through which the supporting body is attached to the probe card.

20. The probe card according to claim 1, wherein,
the supporting body has an annular shape, and
when viewed from a cross-section perpendicular to an axis of the supporting body, each of the anchor receiving portions located inside of the probe existence region has at least three neighboring anchor receiving portions, and a distance between any two of said anchor receiving portions is identical.

21. A probe card to perform an inspection by coming in contact with a test object, comprising:
   a probe substrate having a first surface and a second surface;
   a plurality of probes arranged on a first surface;
      a plurality of anchor receiving portions arranged on a second surface;
   a supporting body disposed to abut and support a periphery of the probe substrate; and
   a probe existence region that is defined on the second surface of the probe substrate and contains anchor receiving portions, wherein
   those anchor receiving portions within the probe existence region are disposed regularly in such a manner that neighboring anchor receiving portions are arranged at substantially equal distances from each other,
   unit shapes are formed by a plurality of the neighboring anchor receiving portions, and
   each of the unit shapes has a substantially equal area.

* * * * *